United States Patent [19]

Kameya

[11] Patent Number: 5,331,298
[45] Date of Patent: Jul. 19, 1994

[54] INDUCTIVE DEVICE FOR AN ELECTROMAGNETIC DELAY LINE AND METHOD FOR FABRICATING THE SAME

[75] Inventor: Kazuo Kameya, Tokyo, Japan
[73] Assignee: Elmec Corporation, Japan
[21] Appl. No.: 3,190
[22] Filed: Jan. 12, 1993

[30] Foreign Application Priority Data

Jan. 16, 1992 [JP] Japan ................................. 4-24338

[51] Int. Cl.[5] .......................... H03H 7/32; H01F 15/10
[52] U.S. Cl. ...................................... 333/138; 333/140; 336/192; 29/605
[58] Field of Search ................... 333/138–140, 333/185, 156; 336/192, 196, 199, 205, 208; 29/605, 606

[56] References Cited

U.S. PATENT DOCUMENTS 648,446   5/1900  Varley .................................... 336/192
4,649,356 3/1987  Kameya ................................. 333/138

FOREIGN PATENT DOCUMENTS 0186413 10/1984 Japan .................................... 333/140

Primary Examiner—Seungsook Ham
Attorney, Agent, or Firm—Wegner, Cantor, Mueller & Player

[57] ABSTRACT

A lumped constant type electromagnetic delay line employs an inductive device consisting of a plurality of turns of electroconductive wire in combination with chip capacitors connected to a plurality of taps provided in the inductive device so as to form a ladder circuit consisting of a plurality of delay circuit sections. The coil wire ends and the taps of the inductive device of the present invention are all twisted and extended in the same direction, and are all provided with a uniform and sufficient rigidity. Therefore, the process of connecting these taps and coil wire ends to the corresponding electrodes is simplified, and is therefore made better adapted for automatization. During the process of manufacture, a series of inductive devices can be fabricated as a continuous process of winding a coil wire around an elongated bobbin, and all the taps and coil wire ends are laterally extended and twisted in the same manner so that the entire process is significantly simplified. After the process of winding the continuous coil and extending the taps, the continuous bobbin is cut into individual inductive devices.

5 Claims, 4 Drawing Sheets

INDUCTIVE DEVICE FOR AN ELECTROMAGNETIC DELAY LINE AND METHOD FOR FABRICATING THE SAME

TECHNICAL FIELD

The present invention relates to an inductive device for an electromagnetic delay line, and a method for fabricating the same. In particular, the present invention relates to an inductive device which is suitable for use in a lumped constant type electromagnetic delay line capable of providing a large delay and handling high speed signals, and an improved method for fabricating the same.

BACKGROUND OF THE INVENTION

A conventional lumped constant type electromagnetic delay line typically comprises an inductive device consisting of a plurality of turns of electroconductive wire, and chip capacitors connected to a plurality of taps provided in the inductive device so as to form a ladder circuit consisting of a plurality of sections. The inventor of this patent application previously proposed in U.S. Pat. No. 4,649,356 an electromagnetic delay line of this type featuring a small size and low manufacturing cost.

According to this electromagnetic delay line, as illustrated in FIG. 7, a pair of first intermediate electrodes 3 and 5 serving as input and output electrodes and second intermediate electrodes 7 placed between the first intermediate electrodes 3 and 5 are all mounted on a major surface of a rectangular mounting plate 1 in mutually spaced relationship, and an inductive device 11 is formed by a plurality of turns of electroconductive wire wound around a bobbin 9 consisting of a rectangular plate. Two ends 11a and 11b and intermediate taps 11c of the inductive device 11 are soldered to the first intermediate electrodes 3 and 5 and the second intermediate electrodes 7, respectively, along a long side of the rectangular mounting plate 1, and a composite capacitor 13 consisting of an array of capacitors is soldered to the intermediate electrodes 3, 5 and 7 on the major surface of the mounting plate 1.

The intermediate electrodes 3, 5 and 7 extend from the mentioned long side to the vicinity of the other long side of the mounting plate 1 on which a connecting electrode 15 is centrally formed. The composite capacitor 13 is connected to this connecting electrode 15 via a connecting piece 17, and input, output and common terminals 19, 21 and 23 are connected to the input, output and connecting electrodes 3, 5 and 15, respectively.

As illustrated in FIG. 8, the composite capacitor 13 is provided with an elongated rectangular dielectric plate 13a, a common electrode 13b placed on one side (reverse side as seen in FIG. 8) thereof substantially over an entire length thereof, and a plurality of capacitive electrodes 13c arranged on the other side of the dielectric plate 13a so as to correspond to the first intermediate electrodes 3 and 5 and the second electrode 7. By soldering these capacitive electrodes 13c to the corresponding first and second intermediate electrodes 3, 5 and 7, a lumped constant type electromagnetic delay line is formed.

The inductive device 11 is fabricated as illustrated in FIG. 9 from the view point of improving the production efficiency and reducing the manufacturing cost.

More specifically, an end of electroconductive wire is retained by a clamp of a winding machine as a leader (the right end in FIG. 9), and the wire is wound around the bobbin 25 from right to the left. At an end of each coil section, the wire is pulled out away from the bobbin 25. The wire is then bent back, and the two runs of the wire are twisted with each other. Thereafter, the next coil section is wound in a similar manner following a few turns of wire in a coarse pitch wound around the bobbin 9 as a connecting coil 27. A plurality of such coil sections are thus wound in series, and a part of the wire between each coil section and the next connecting coil (the parts denoted by "x" in FIG. 9) is severed so as to form each inductive device 11 having two ends 11a and 11b.

In FIG. 9, the wire of only the inductive device on the rightmost end is severed, but the remaining inductive devices may be similarly severed and separated.

After each coil segment is separated, two coil ends 11a and 11b thereof are bent in parallel with the taps 11c, and soldered to the first intermediate electrodes 3 and 5 while the taps 11c are soldered to the second intermediate electrodes 7. Then, the bobbin 25 is cut off from the remaining part.

By thus forming the inductive devices in series along a long bobbin 9 so as to form taps 11c at a pitch corresponding to the pitch of the first intermediate electrodes 3 and 5, and the second intermediate electrodes 7, the process of fabricating the inductive device as well as the process of assembling the electromagnetic delay line is simplified.

However, there is an ever growing demand for improved cost efficiency, and the Inventor realized that there may be a room for further improvement on the manufacturing cost and the manufacturing efficiency of electromagnetic delay lines.

According to the above described inductive device, it is desirable to be able to solder the taps and the two ends to the corresponding electrodes all at the same time instead of soldering them one at a time in view of the manufacturing efficiency.

However, in reality, because each of the two ends 11a and 11b of each inductive device consists of a single wire, and can therefore easily bend, it is somewhat difficult to place them in proper position along with the taps to solder them to the corresponding electrodes all at the same time. Even when they are placed properly over the corresponding electrodes, a soldering iron often pushes the wire away from the proper position during the process of soldering.

In particular, when electromagnetic delay lines are to be manufactured by using inductive devices which are formed by winding a continuous coil around a rod-shaped bobbin 25 and separating it into individual inductive devices, even though a high production efficiency can be attained for the production of inductive devices, there still is a room for improvement in the process of assembling them into electromagnetic delay lines because, due to the above mentioned problem, after the taps each consisting of twisted wire pair are simultaneously soldered to the corresponding electrodes, the two ends must be individually positioned by using a pair of pincers and soldered to the corresponding electrodes.

BRIEF SUMMARY OF THE INVENTION

In view of such problems of the prior art, a primary object of the present invention is to provide an inductive device for an electromagnetic delay line which allows coil taps and coil ends to be connected to corresponding electrodes both easily and reliably.

A second object of the present invention is to provide an inductive device which is made easier to be assembled to an electromagnetic delay line as compared to the prior art inductive device without substantially complicating the process of manufacturing the inductive device.

According to the present invention, these and other objects of the present invention can be accomplished by providing an inductive device for an electromagnetic delay line, comprising: a bobbin having a certain length; a main coil of electroconductive wire wound around the bobbin; at least one extra coil provided adjacent a longitudinal end of the main coil as a continuous extension of the main coil; and at least one intermediate tap formed by extending a certain length of the electroconductive wire laterally from an intermediate part of the main coil, bending a remaining portion of the length of the wire towards the main coil, and twisting the thus formed wire pair with each other; at least one end of the coil wire associated with the extra coil being formed as a terminal tap formed from a part of the coil wire situated between the main coil and the extra coil in a similar manner as the intermediate tap.

Thus, since the coil wire ends and the taps of the inductive device of the present invention are all twisted and extended in the same direction, they are all provided with a uniform and sufficient rigidity so that the process of connecting these taps and coil wire ends to the corresponding electrodes is simplified, and is therefore made better adapted for automatization. Preferably, the extra coil consists of approximately a quarter turn of the electroconductive wire, but, according to the concept of the present invention, may consist of an arbitrary part of one turn of the electroconductive wire as long as it ensures the necessary rigidity of the coil wire ends. If necessary, the extra coil may contain one or more turns in order to achieve a desired rigidity by securing the base end of each of the wire ends to the bobbin.

Further, the present invention provides an electromagnetic delay line, comprising: a lead frame including a common electrode plate, an input electrode plate, and an output electrode plate; a composite capacitor having a common electrode on one side thereof and a plurality of capacitive electrodes arranged in a row on the other side of the composite capacitor, the common electrode being placed over and securely attached to the common electrode plate with the capacitive electrodes facing away from the lead frame; and an inductive device including a bobbin having a certain length, a main coil of electroconductive wire wound around the bobbin, an extra coil provided adjacent each longitudinal end of the main coil as a continuous extension of the main coil, intermediate taps each formed by extending a certain length of the electroconductive wire laterally from an intermediate part of the main coil, bending a remaining portion of the length of the wire towards the main coil, and twisting the thus formed wire pair with each other, and terminal taps each formed by extending a certain length of a part of the coil wire situated between the main coil and the extra coil, bending a remaining portion of the length of the wire towards the bobbin, and twisting the thus formed wire pair with each other; the terminal taps being connected to the input and output electrode plates of the lead frame, respectively, while the intermediate taps are connected to the capacitive electrodes.

Thus, the electromagnetic delay line in the form of a SMD (surface mount device) or a SIP package can be easily fabricated, and the resulting electromagnetic delay line can be conveniently used in automated assembling machines for assembling various circuit boards and electronic equipment.

The inductive device of the present invention can be conveniently fabricated by a method comprising the steps of winding a continuous coil of electroconductive wire around an elongated bobbin along a length thereof; forming a tap after winding each section of the coil by extending a length of the coil wire laterally away from the coil, bending a remaining portion of the length of the coil wire toward the coil, and twisting the thus formed wire pair with each other; cutting the bobbin along with the coil wire into bobbin segments each forming an individual inductive device in such a manner that each inductive device includes at least one intermediate tap formed at an intermediate part of the bobbin segment, and at least one terminal tap formed at a longitudinal end of the bobbin segment. Preferably, the coil of electroconductive wire includes a main coil which is to be located centrally in each completed inductive device, and a connecting coil having a more coarse pitch than the main coil and located between each two adjacent main coils.

Thus, according to the method of fabricating the inductive device based on the present invention, a series of inductive devices can be fabricated as a continuous process of winding a coil wire around an elongated bobbin, and all the taps and coil wire ends are laterally extended and twisted in the same manner so that the entire process is significantly simplified. After the process of winding the continuous coil and extending the taps, the continuous bobbin is cut into individual inductive devices.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
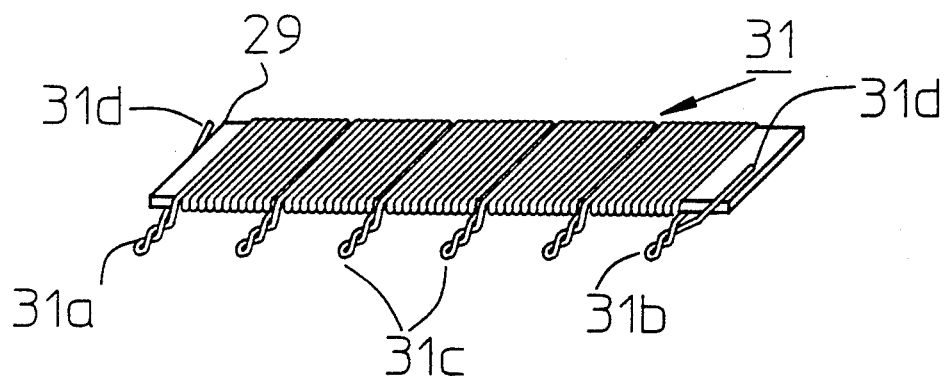
FIG. 1 is a perspective view of an embodiment of the inductive device for an electromagnetic delay line according to the present invention.

Referring to FIG. 1 illustrating a preferred embodiment of the present invention, an inductive device for an electromagnetic delay line 31 is formed by winding a plurality of turns of electroconductive wire around a bobbin 29 consisting of an elongated rectangular plate in a single layer. According to this inductive device 31, a tap 31c is provided for each prescribed number of turns by extending a certain length of the coil wire laterally away from the bobbin 29, bending it back, and twisting the thus paired wire. Each of the wire ends is similarly treated as denoted by numeral 31a or 31b, and a small length of the coil wire is placed over the bobbin 29 as an unused part 31d.

Figure 7:
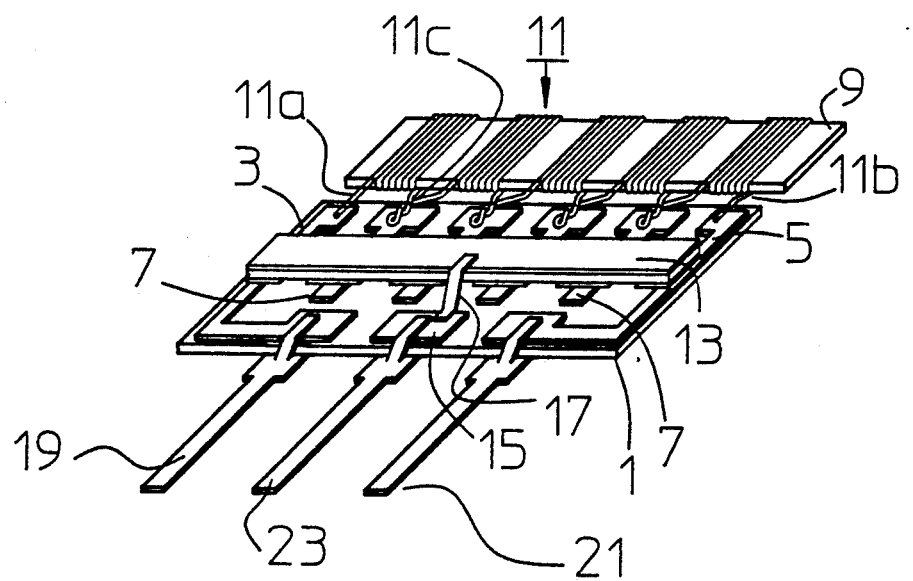
FIG. 7 is a perspective view of one of the conventional electromagnetic delay lines.
Figure 8:
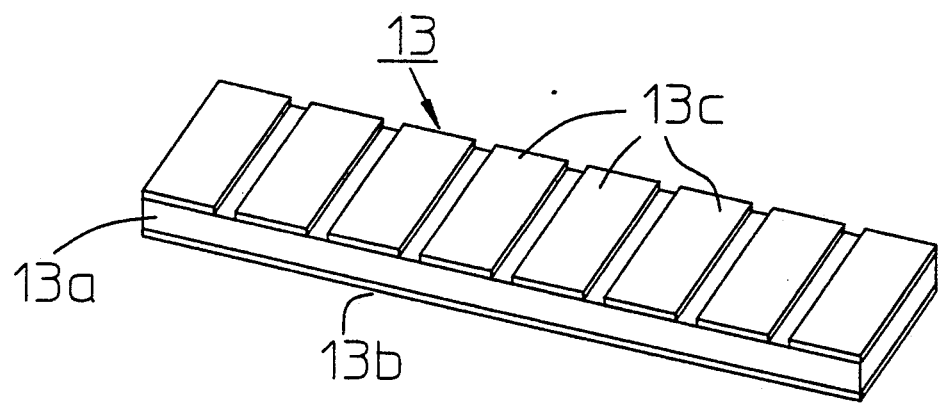
FIG. 8 is a perspective view of a composite capacitor consisting of an array of capacitors which may be used in the electromagnetic delay line according to the present invention.
Figure 9:
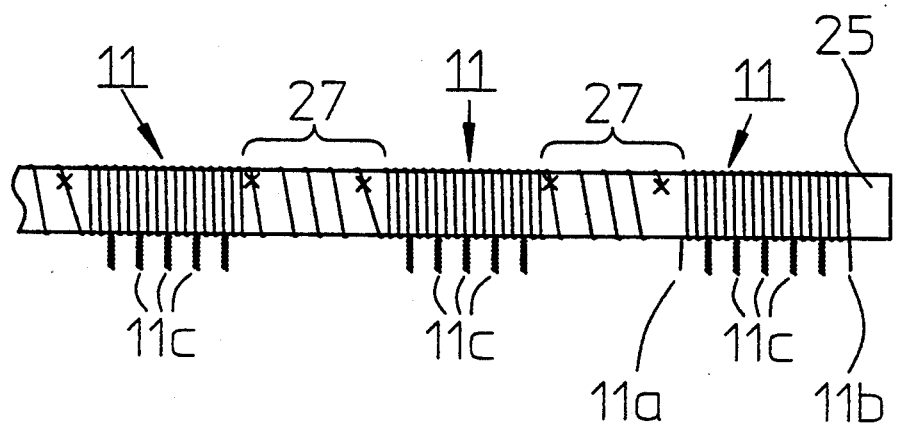
FIG. 9 is a view similar to FIG. 2 showing the conventional inductive devices before they are separated during the conventional process of manufacturing inductive devices.

The inductive device 31 thus fabricated can be assembled to a lumped constant type electromagnetic delay line by trimming the taps 31c and the two ends 31a and 31b, and soldering or otherwise connecting them to the first and second intermediate electrodes 3, 5 and 7 (refer to FIG. 7) and the capacitive electrodes 13c of the composite capacitor 13 (refer to FIG. 8).

According to such an inductive device, since the two ends each consist of a twisted wire pair, and are therefore provided with a certain level of rigidity, they can be as easily positioned as the taps 31c. Therefore, when assembling the inductive device to an electromagnetic delay line, the two ends 31a and 31b as well as the taps 31c can be soldered to the corresponding electrodes all at the same time. Since this process does not involve any complicated step such as the conventional step of supporting the two ends with a pair of pincers, it can be easily automated.

Now the method of fabricating the inductive device for an electromagnetic delay line according to the present invention is described in the following.

Figure 2:
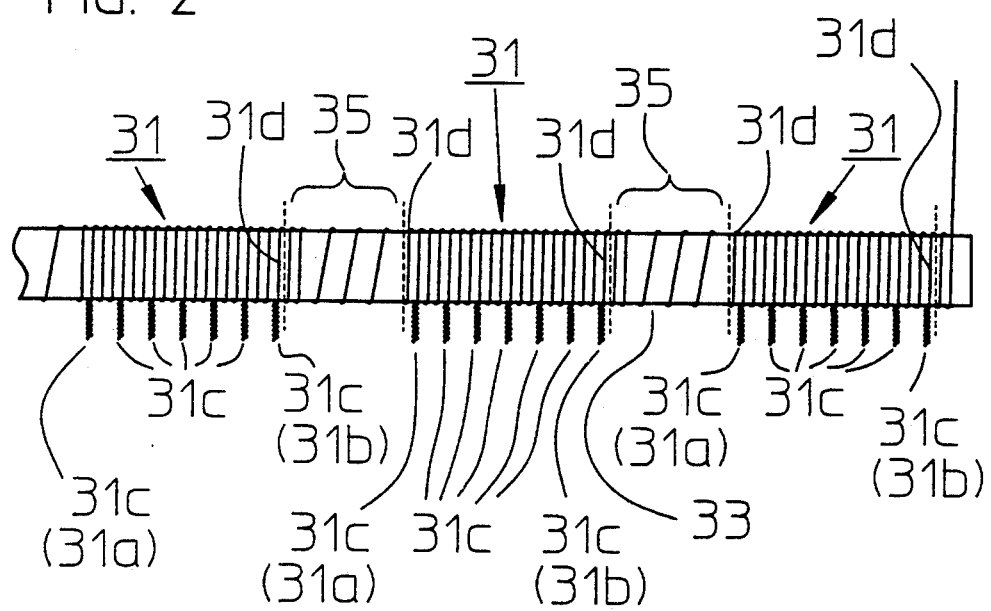
FIG. 2 is a plan view of the inductive devices before they are separated during the process of manufacture according to an embodiment of the present invention.

Referring to FIG. 2, an end of the coil wire is secured with a clamp of a winding machine not shown in the drawing as a leader, and the coil wire is wound around an elongated flat bobbin 33 from the right end thereof to the left as seen in FIG. 2. After a prescribed number of turns are wound around the bobbin 33, the coil wire is extended by a certain length laterally away from the bobbin, and is then bent back. The thus paired wire is twisted, and the remaining part of the coil of the inductive device is continued to be wound in a similar fashion. When a certain number of turns are wound and a certain number of taps 31c are formed, a single inductive device 31 having a corresponding number of coil sections is formed.

Thereafter, a connecting coil 35 is wound at a more coarse pitch over a certain length, and the main coil of the next inductive device is wound in the same way as described above.

When the main coil of the final inductive device has been wound, a certain length of the coil wire is wound at a coarse pitch in the same way as the connecting coil.

As denoted by numeral 31d, a few turns or a fraction of a turn of the coil wire is wound around the bobbin 33 substantially at a same pitch as the coil of the inductive device 31 at each of the boundary regions between the main coil 31 and the connecting coil 35.

Figure 3:
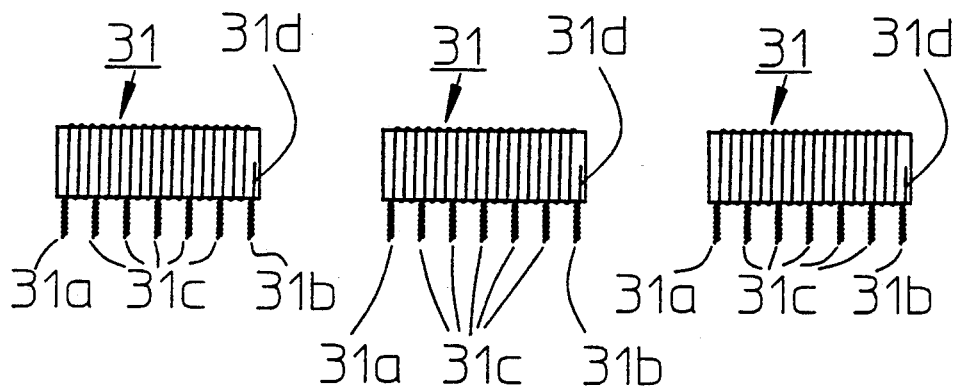
FIG. 3 is a plan view of the inductive devices after they are separated during the process of manufacture.

When the bobbin 33 is cut at the two ends of each connecting coil along with the coil wire, individual inductive devices 31 is obtained as illustrated in FIG. 3.

The provision of the extra parts 31d of the main coil ensures the stability of the coil wire ends 31a and 31b. If necessary epoxy resin or other bonding agent may be used to secure the extra parts 31d of the main coil on the bobbin 33.

According to the thus fabricated inductive device, the two ends of the coil wire 31a and 31b are given as the outermost taps 31c, and the need for the special handling of the two ends of the coil wire is eliminated. In particular, because the two ends 31a and 31b are formed in the same way as the normal taps 31c, and are therefore provided with a similar rigidity for resisting bending deformation, the positioning of the two ends 31a and 31b onto the corresponding electrodes as a preliminary step for soldering is facilitated. The simplified treatment of the two ends further allows the fabrication of the inductive devices as well the assembling of the inductive devices to electromagnetic delay lines to be automated.

The presence of the extra coil 31d, for instance consisting of a quarter of one turn will not in any way affect the electric property of the electromagnetic delay line.

Now the process of assembling the series of inductive devices illustrated in FIG. 2 to electromagnetic delay lines is described in the following.

Figure 4:
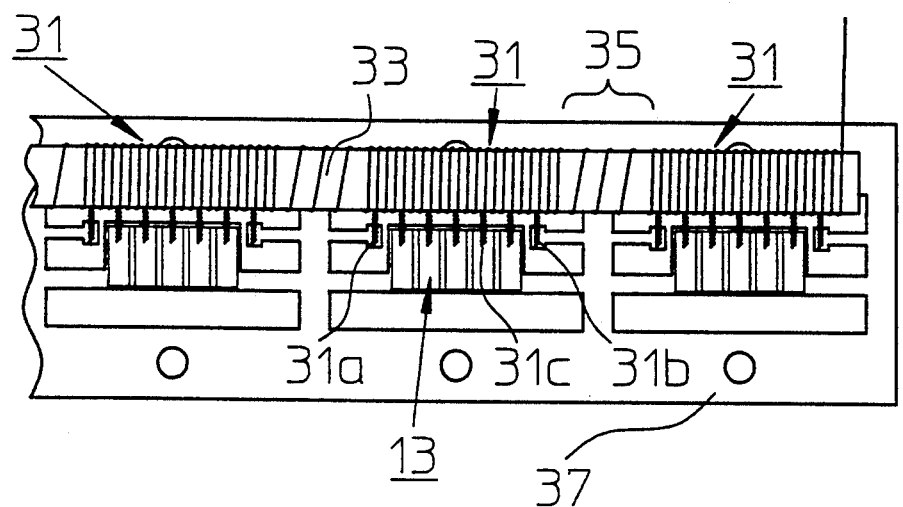
FIG. 4 is a plan view of the electromagnetic delay lines during the process of assembling the electromagnetic delay lines.
Figure 5:
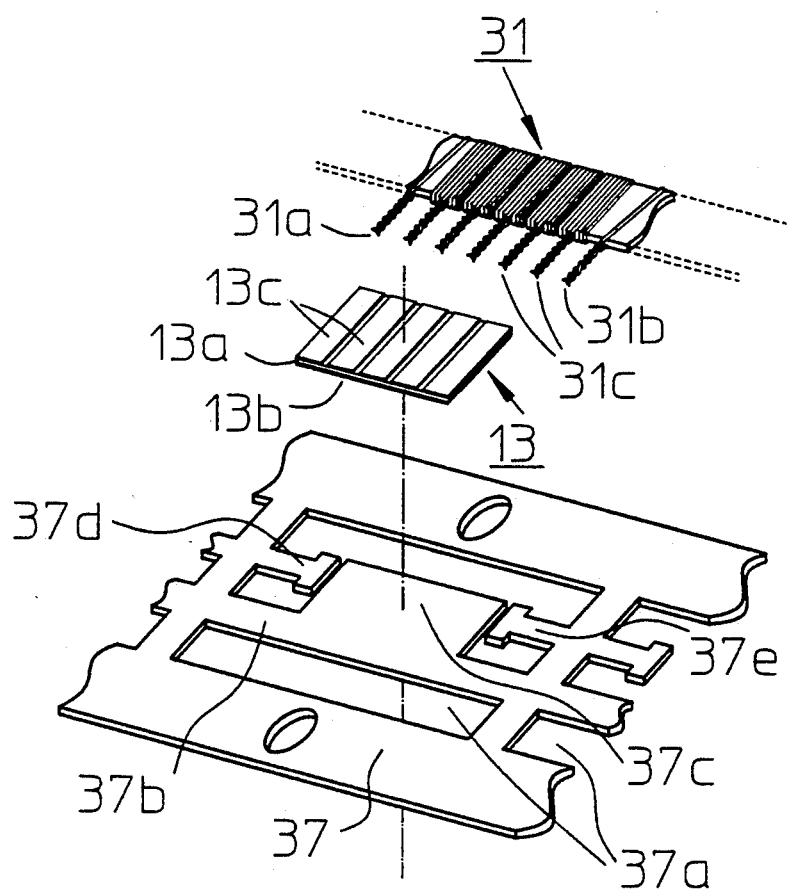
FIG. 5 is an exploded perspective view of one of the electromagnetic delay lines during the assembling process.

Referring to FIGS. 4 and 5, a lead frame 37 is used. This lead frame 37 is provided with a plurality of windows 37a at equal interval along the length of the lead frame 37, and a common electrode plate 37c having a rectangular shape is formed in a middle part of a connecting piece 37b extending across each of the windows 37a along the length of the lead frame 37. Input and output electrode plates 37d and 37e extend from either longitudinal end of each of the windows 37a to the vicinity of the common electrode plate 37c. The composite capacitor 13 is placed on the common electrode plate 37c (refer to FIG. 8), and is electrically connected to the common electrode 13b of the composite capacitor 13.

Then, the elongated bobbin 33 carrying a series of inductive devices 34 formed thereon as illustrated in FIG. 2 is placed over the lead frame 37, and the two coil ends 31a and 31b of each main coil 31 are placed onto the input electrode plate 37d and the output electrode plate 37e, respectively, while the taps 31c of each main coil are placed over the corresponding capacitive electrodes 13c of the composite capacitor 13. Then, the coil ends 31a and 31b and the taps 31c of each main coil 31 are soldered to the corresponding electrodes.

Figure 6:
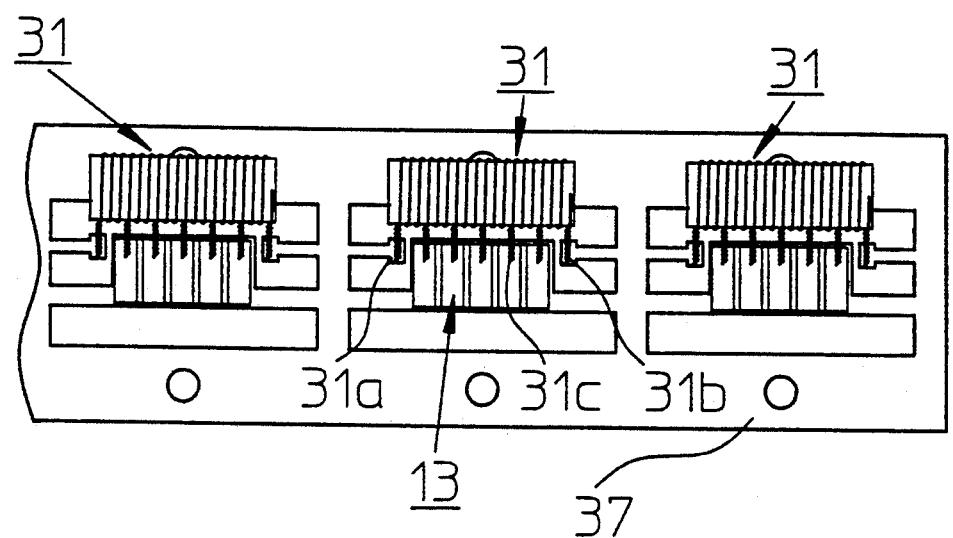
FIG. 6 is a view similar to FIG. 4 showing the electromagnetic delay lines during the assembling process according to the present invention.

Then, the rod-like bobbin 33 along with the electroconductive wire is cut as illustrated in FIG. 6, and the assembly is transfer molded either as it is or after the inductive device 31 is placed over the composite capacitor 13 or the common electrode plate 37c with an insulating sheet made of epoxy resin (not shown in the drawings) placed therebetween, and secured thereto by heating. Thereafter, the connecting pieces 37b of the lead frame 37 and the input and output electrode plates 37d and 37e are cut apart, and the electromagnetic delay lines are separated into completed individual pieces formed as surface mount devices.

According to the electromagnetic delay line thus fabricated, a very small number of component parts are required because it can simply consist of three components, an inductive device 31, a composite capacitor 13 and a lead frame 37 having the common electrode plates 37c and the input and output electrode plates 37d and 37e.

Further, because the taps and leads from the inductive device are directly connected to the capacitive electrodes 13c of the composite capacitor 13, and the input and output electrode plates 37d and 37e, it is possible to eliminate the need for the intermediate mounting plate 1 and the intermediate electrodes 3, 5 and 7 and the connecting piece 15 for connecting the taps of the inductive device to the input, output and common terminals 19, 21 and 23. In this way, the process of connecting the inductive device to the composite capacitor is simplified, and the electromagnetic delay line can be reduced in size.

As described above, since the coil wire ends and the taps of the inductive device of the present invention are all twisted and extended in the same direction, they are all provided with a uniform and sufficient rigidity so that the process of connecting these taps and coil wire ends to the corresponding electrodes is simplified, and is therefore made better adapted for automatization.

Further, according to the method of fabricating the inductive device based on the present invention, a series of inductive devices can be fabricated as a continuous process of winding a coil wire around an elongated bobbin, and all the taps and coil wire ends are laterally extended and twisted in the same manner so that the entire process is significantly simplified. After the process of winding the continuous coil and extending the taps, the continuous bobbin is cut into individual inductive devices.

Although the present invention has been described in terms of a specific embodiment, it is possible to modify and alter details thereof without departing from the spirit of the present invention.

What I claim is:

1. An inductive device for an electromagnetic delay line, comprising:
   a bobbin having a certain length;
   a main coil of electroconductive wire wound around said bobbin;
   at least one extra coil provided adjacent a longitudinal end of said main coil as a continuous extension of said main coil; and
   at least one intermediate tap, said at least one intermediate tap including a twisted, doubled length of said electroconductive wire extending laterally from an intermediate part of said main coil;
   at least one end of said coil wire associated with said extra coil being formed as a terminal tap formed as a twisted, doubled length of a part of said coil wire situated between said main coil and said extra coil.

2. An inductive device according to claim 1, wherein said extra coil consists of a certain length of said electroconductive wire.

3. An electromagnetic delay line, comprising:
   a lead frame including a common electrode plate, an input electrode plate, and an output electrode plate;
   a composite capacitor having a common electrode on one side thereof and a plurality of capacitive electrodes arranged in a row on the other side of said composite capacitor, said common electrode being placed over and securely attached to said common electrode plate with said capacitive electrode facing away from said lead frame; and
   an inductive device including a bobbin having a certain length, a main coil of electroconductive wire would around said bobbin, an extra coil provided adjacent each longitudinal end of said main coil as a continuous extension of said main coil, intermediate taps each formed of a twisted, doubled length of said electroconductive wire extending laterally from an intermediate part of said main coil, and terminal taps each formed by a twisted, doubled, length of a part of said coil wire situated between said main coil and said extra coil;
   said terminal taps being connected to said input and output electrode plates of said lead frame, respectively, and said intermediate taps being connected to said capacitive electrodes.

4. A method of fabricating an inductive device for an electromagnetic delay line, comprising the steps of;
   winding a main coil of electroconductive wire around an elongated bobbin along a length thereof;
   winding at least one extra coil adjacent a longitudinal end of said main coil as a continuous extension of said main coil;
   forming at least one intermediate tap after winding each section of said coil by extending a length of said coil wire laterally away from said coil, bending a remaining portion of said length of said coil wire toward said coil, and twisting the thus formed wire pair with each other; and
   forming a terminal tap by extending a length of a part of said coil wire situated between said main coil and said extra coil laterally away from said extra coil, bending a remaining portion toward said extra coil, and twisting the thus formed wire pair with each other in the same direction in which the wire pair forming the intermediate tap was twisted.

5. A method for fabricating an inductive device according to claim 4, wherein said main coil is located centrally in said inductive device, and further comprising the step of winding a connecting coil having a more coarse pitch than said main coil, said connecting coil being located adjacent said main coil.

* * * * *